(12) United States Patent
Thalhammer

(10) Patent No.: US 7,187,238 B2
(45) Date of Patent: Mar. 6, 2007

(54) CIRCUIT FOR ADJUSTING THE OPERATING POINT OF MULTIPLE GATE FIELD EFFECT TRANSISTORS

(75) Inventor: Robert Thalhammer, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/172,441

(22) Filed: Jun. 30, 2005

(65) Prior Publication Data

US 2006/0006491 A1   Jan. 12, 2006

Related U.S. Application Data

(63) Continuation of application No. PCT/EP03/13321, filed on Nov. 26, 2003.

(30) Foreign Application Priority Data

Dec. 30, 2002   (DE)   ............... 102 61 388

(51) Int. Cl.
    *H03F 3/16*   (2006.01)
(52) U.S. Cl. ............. 330/277; 330/285; 330/307
(58) Field of Classification Search .......... 330/277, 330/285, 307
    See application file for complete search history.

(56) References Cited

U.S. PATENT DOCUMENTS

| 3,789,246 A | 1/1974 | Preisig et al. ........ 327/543 |
| 3,872,491 A | 3/1975 | Hanson et al. ........ 257/403 |
| 5,337,019 A | 8/1994 | Musiol .............. 330/227 |
| 6,433,639 B1 | 8/2002 | Numanami et al. ...... 330/277 |
| 6,900,850 B2 * | 5/2005 | Yamamoto ............ 348/731 |

FOREIGN PATENT DOCUMENTS

| JP | 59095705 | 6/1984 |
| JP | 11026776 | 1/1999 |

OTHER PUBLICATIONS

Chen et al., "Low-Voltage Single Power Supply Four-Quadrant Multiplier Using Floating-Gate MOSFETs", 1997 IEEE International Symposium on Circuits and Systems, Hong Kong, Jun. 1997, pp. 237-240, (4 pages).

Koizumi et al., "A GaAs Single Balanced Mixer MMIC with Built-in Active Balun for Personal Communications Systems", 1995 IEEE Microwave and Millimeter-Wave Monolithic Circuits Symposium, May 1995, pp. 77-80, (4 pages).

* cited by examiner

*Primary Examiner*—Steven J. Mottola
(74) *Attorney, Agent, or Firm*—Maginot, Moore & Beck

(57) ABSTRACT

An amplifier circuit includes a first multiple gate field-effect transistor having a source terminal, a drain terminal, at least one signal gate terminal for receiving an input signal and at least one control gate terminal for receiving a control signal, and a second multiple gate field-effect transistor having a source terminal, a drain terminal, at least one signal gate terminal connected to the signal gate terminal of the first multiple gate field-effect transistor, and a control gate terminal connected to the control gate terminal of the first multiple gate field-effect transistor, the signal gate terminal of the second multiple gate field-effect transistor being connected to that source terminal/drain terminal of the second multiple gate field-effect transistor which is closer to the signal gate terminal of the second multiple gate field-effect transistor.

23 Claims, 5 Drawing Sheets

A)

B)

US 7,187,238 B2

CIRCUIT FOR ADJUSTING THE OPERATING POINT OF MULTIPLE GATE FIELD EFFECT TRANSISTORS

CROSS-REFERENCE TO RELATED APPLICATION

This application is a continuation of copending International Application No. PCT/EP03/13321, filed Nov. 26, 2003, which designated the United States and was not published in English, and is incorporated herein by reference in its entirety.

BACKGROUND OF THE INVENTION

1. Field of the Invention

The present invention relates to an amplifier circuit having multiple gate field-effect transistors of improved adjustment of the operating point and improved control characteristics.

2. Description of the Related Art

Examples of multiple gate field-effect transistors (MG-FETs) are shown in FIG. 1. The setup of a respective transistor structure will be explained in greater detail with reference to the schematic illustration of FIG. 1.

In FIG. 1A, an MG-FET including three gate structures $GS_1$, $GS_2$ and $GS_3$, a first region $B_1$ connected to a first terminal S, and a second region $B_2$ connected to a second terminal D is shown. The regions $B_1$ and $B_2$ are formed in a conventional manner in a semiconductor substrate, such as, for example, by suitably doped regions therein. A channel region K including a plurality of channel portions $K_1$, $K_2$ and $K_3$ associated to the respective gate structures $GS_1$, $GS_2$ and $GS_3$ is formed between the first region $B_1$ and the second region $B_2$. In the example shown in FIG. 1A, the first gate structure $GS_1$ is connected to a first gate terminal $G_1$ of the MG-FET, the second gate structure $GS_2$ is connected to the first terminal S of the MG-FET and the third gate structure $GS_3$ is connected to a second gate terminal $G_2$ of the MG-FET.

Another example of an MG-FET is shown in FIG. 1B, the same reference numerals as in FIG. 1A being employed here. In contrast to the example shown in FIG. 1A, none of the gate structures is connected to a terminal according to FIG. 1B. Rather, the gate structures $GS_2$ and $GS_3$ are connected to each other and connected to the second gate terminal $G_2$ of the MG-FET. The first gate structure $GS_1$ is connected to the first gate terminal $G_1$ of the MG-FET.

Since the MG-FETs according to FIG. 1 each comprise two gate terminals, they are also referred to as dual gate FETs (DG-FETs). It is, however, obvious to those skilled in the art that, apart from the configurations shown in FIG. 1, other FETs having only two gate structures or having more than three gate structures may be used. Also, any number of gate terminals, that is also more than two terminals, may be provided, wherein in this case the gate structures would have to be connected in a suitable way.

MG-FETs are used for amplifier circuits, wherein an input signal is received via one or several gate terminals (signal gate terminals) and a control signal with the help of which the gain of the amplifier circuit can be adjusted is received via one or several other gate terminals (control gate terminals). For tuners, the DG-FETs described above having only one signal gate terminal and one control gate terminal, which in this context are also referred to as tuner tetrodes or, in the case of an MOS-DG-FET, as MOS tuner tetrodes, are preferably employed. The operating point of such an amplifier circuit is adjusted using an auxiliary wiring integrated with the MG-FET on a chip. The function of this auxiliary wiring has a decisive impact on the control characteristic or the dependence of the gain of the MG-FET on the control voltage at the control gate terminals provided for this, which are also referred to as AGC gate terminals (AGC=automatic gain control).

The gain of the MG-FET or the amplifier circuit formed with it is a strictly monotonic increasing function with low and medium voltages at the control gate terminals of the MG-FET. In this region, the MG-FET may, for example, be operated together with an automatic gain control (AGC) increasing the amplification with small input signals and decreasing the amplification with large input signals, to obtain an output signal having a constant quantity or amplitude independently of the quantity of the input signal. The region of low and medium voltages at the control gate terminals of the MG-FET where the gain thereof is a strictly monotonic function, is also referred to as the AGC region. With higher voltages at the control gate terminal of the MG-FET, the amplification thereof is saturated since the portions of the channel of the MG-FET associated to the control gate terminals are completely open or formed. In this region, the gain of the MG-FET is largely constant, independently of the voltage at the control gate terminals of the MG-FET. The ideal and desired control characteristic of an amplifier circuit having an MG-FET features a transition between the AGC region and the saturation region, which is as smooth and soft as possible.

FIG. 2 shows an example of a conventional amplifier circuit 10. In this example, MG-FETs having a signal gate terminal and a control gate terminal, that is DG-FETs, are used. The amplifier circuit includes a first DG-FET or main DG-FET 20. The first DG-FET includes a signal gate terminal (gate 1) 22, a control gate terminal (gate 2) 24, a source terminal 26 and a drain terminal 28. In the example shown in FIG. 2, the setup and the wiring of the first DG-FET 20 are such that the signal gate terminal 22 and the control gate terminal 24 are associated to two portions of a channel via gate structures, as is shown in FIG. 1. We assume an exemplary configuration, as is shown in FIG. 1B. In this case, the gate structure $GS_1$ is associated to the signal gate terminal 22 and thus to the channel portion $K_1$. The gate structures $GS_2$ and $GS_3$ and thus the channel portions $K_2$ and $K_3$ are associated to the control gate terminal 24. The source terminal 26 is connected to the first region $B_1$ and the drain terminal 26 is connected to the second region $B_2$. Thus, a gate structure associated to the signal gate terminal 22 is arranged on the source side to the source terminal 26 and a gate structure associated to the control gate 24 is arranged on the drain side to the drain terminal 28. The first DG-FET 20 is arranged within a well in a substrate or directly in the substrate where the amplifier circuit 10 is formed. When the first DG-FET is an n-channel FET, the well is a p-well, when the first DG-FET is a p-FET, the well is an n-well. The well is preferably connected to the source 26 in an electrically conductive way.

The amplifier circuit 10 additionally comprises a second DG-FET 30 or an auxiliary DG-FET which preferably has a similar or identical setup to the first DG-FET 20. In particular, the second DG-FET 30 comprises a signal gate terminal 32, a control gate terminal 34, a source terminal 36 and a drain terminal 38 connected to the gate structures and regions as has been described above referring to the first DG-FET. Like in the first DG-FET, the signal gate terminal 32 is thus arranged on the source side and the control gate terminal 34 is arranged on the drain side. The well within which the second DG-FET 30 is arranged, in turn, is connected to the source 36.

The signal gate terminal 22 of the first DG-FET 20 and the signal gate terminal 32 of the second DG-FET 30 are connected to each other and connected to a signal input 42 of the amplifier circuit 10. The control gate terminal 24 of the first DG-FET 20 and the control gate terminals 34 of the second DG-FET 30 are connected to each other and connected to a control input 44 of the amplifier circuit 10. The source terminal 26 of the first DG-FET 20 and the source terminal 36 of the second DG-FET 30 are connected to each other and connected to a first exterior terminal (source) 46 of the amplifier circuit 10. The drain terminal 28 of the first DG-FET 20 is connected to a second exterior terminal (drain) 48 of the amplifier circuit 10. The drain terminal 38 of the second DG-FET 30 is connected to the signal gate terminal 32 of the second DG-FET 30 and thus, at the same time, connected to the signal gate terminal 22 of the first DG-FET 20 and the signal input 42 of the amplifier circuit 10.

The amplifier circuit 10 is usually operated by applying a direct voltage vdd from a supply voltage terminal 54 to the signal input 42 via a resistor 52, the voltage setting the operating point of the second DG-FET 30 and thus of the first DG-FET 20 with regard to the voltage at the signal gate terminal 22. At the same time, an (alternating current) input signal, such as, for example, an HF signal, from an input signal terminal 58 is coupled or applied capacitively to the signal input 42 of the amplifier circuit 10 via a capacitor 56. By the input signal, the resistance of a channel portion of the first DG-FET 20 associated thereto is controlled via the signal gate terminal 22 and also, with a voltage, applied from the outside, between the terminal 46 and the terminal 48, a current from the source terminal 26 through the channel of the first DG-FET 20 to the drain terminal 28. A control voltage is applied via the control input 44 to the amplifier circuit 10 and, in particular, to the control gate terminal 24 of the first DG-FET modulating the resistance of the portion of the channel of the first DG-FET 20 associated to the control gate terminal 22 and also the current between the source terminal 26 and the drain terminal 28. The control input 44 or the control voltage applied thereto is used to adjust or control the gain of the amplifier circuit 10. For this, the control voltage is usually only varied slowly.

The auxiliary wiring of the first DG-FET 20 by means of the second DG-FET 30 (auxiliary tetrode) illustrated with reference to FIG. 2 serves to adjust the operating point but has a serious practical disadvantage. When the gain is to be reduced starting from a saturation region, that is from a control voltage at the control input 44 where the amplifier circuit 10 has its maximum gain, by reducing the control voltage applied to the control input 44, the resistance of the portion of the channel of the second DG-FET 30 associated to the control gate terminal 34 increases since the control voltage is also applied to the control gate terminal 34. Thus, there is a higher voltage drop at the auxiliary tetrode or the second DG-FET 30 or between the source terminal 36 and the drain terminal 38 of the second DG-FET 30, this voltage in turn decreasing the resistance of that channel via the signal gate terminal 22 of the first DG-FET 20. This counteracts the intended reduction and results in an increase in the current between the source terminal 26 and the drain terminal 28 of the first DG-FET 20. In general, the decisive factor for the potential at the drain terminal 38 to decrease or increase with a decreasing potential at the control gate terminal 34 is the dimensioning of the second DG-FET (such as, for example, ratio of channel lengths, channel profiles, substrate control, etc.).

What is more, the channel portion of the second DG-FET 30 associated to the control gate terminal 34 is strongly controlled by the substrate potential since both portions of the channel of the second DG-FET 30 are arranged in one and the same well connected to the source terminal 36 of the second DG-FET 30. This problem could, however, be solved by a "dual well technology" (two separate wells), which would, however, entail considerable complexity as far as manufacturing is concerned.

Both effects described cause, when regulating the amplifier circuit 10 or reducing the gain of the amplifier circuit 10, a marked break in the gain characteristic at a control voltage or voltage $V_{g2}$ at the control gate terminals 24, 34 of the DG-FETs 20, 30 of $V_{g2}$=1.6 V, and a superelevation or excessive increase in the current between the source terminal 26 and the drain terminal 28 having a relatively abrupt onset. The break in the gain characteristic and the current superelevation are considerable disadvantages of the conventional amplifier circuit illustrated referring to FIG. 2.

SUMMARY OF THE INVENTION

It is an object of the present invention to provide an amplifier circuit allowing a smoother transition between the saturation region and the AGC region.

In accordance with a first aspect, the present invention provides an amplifier circuit having: a signal input; a first multiple gate field-effect transistor having a source terminal, a drain terminal, at least one signal gate terminal for receiving an input signal from the signal input and at least one control gate terminal for receiving a control signal; and a second multiple gate field-effect transistor having a source terminal, a drain terminal, at least one signal gate terminal connected to the signal gate terminal of the first multiple gate field-effect transistor, and a control gate terminal connected to the control gate terminal of the first multiple gate field-effect transistor, each of the multiple gate field-effect transistors having: a first region associated to a drain terminal or a source terminal, a second region associated to a source terminal or a drain terminal, a channel region arranged between the first region and the second region, at least one first gate structure associated to a first portion of the channel region and arranged adjacent to the first region, the first gate structure being associated to the signal gate terminal or to the control gate terminal, and at least one second gate structure associated to a second portion of the channel region and arranged adjacent to the second region, the second gate structure being associated to the control gate terminal or to the signal gate terminal, characterized in that the gate structure of the second multiple gate field-effect transistor associated to the signal gate terminal is connected to the region which is adjacent to the channel region of this gate structure.

Preferably, in the amplifier circuit each of the multiple gate field-effect transistors includes a first region associated to a drain terminal or a source terminal, a second region associated to a source terminal or a drain terminal, a channel region arranged between the first region and the second region, at least one first gate structure associated to a first portion of the channel region and arranged adjacent to the first region, and at least one second gate structure associated to a second portion of the channel region and arranged adjacent to the second region.

According to a first embodiment, in the first multiple gate field-effect transistor, the signal gate terminal is connected to the first gate structure, the control gate terminal is connected to the second gate structure, the source terminal is connected to the first region and the drain terminal is connected to the second region, and in the second multiple gate field-effect transistor, the signal gate terminal is connected to the first gate structure, the control gate terminal is connected to the second gate structure, the source terminal is connected to the second region and the drain terminal is connected to the first region, the signal gate terminal of the second multiple gate field-effect transistor being connected to the drain terminal.

According to a second embodiment, in the first multiple gate field-effect transistor, the signal gate terminal is connected to the first gate structure, the control gate terminal is connected to the second gate structure, the source terminal is connected to the first region and the drain terminal is connected to the second region, and in the second multiple gate field-effect transistor, the signal gate terminal is connected to the second gate structure, the control gate terminal is connected to the first gate structure, the source terminal is connected to the first region and the drain terminal is connected to the second region, the signal gate terminal of the second multiple gate field-effect transistor being connected to the drain terminal.

The present invention is based on the idea of forming auxiliary MG-FETs such that the gate terminal(s) connected to the gate terminal(s) of the main MG-FET for receiving the control signal, when operating, is (are) at a lower potential (in n-channel FETs) or a higher potential (in p-channel FETs) than the gate terminal(s) of the auxiliary MG-FET connected to the gate terminal(s) of the main MG-FET for receiving the input signal.

If the auxiliary MG-FET is a dual gate FET (DG-FET), this means that the auxiliary wiring is to be selected such that a gate terminal of the auxiliary dual gate FET is to be connected to that source or drain terminal of the auxiliary DG-FET at the side of which the gate terminal is arranged. A reduction of channel resistance of the (drain side) channel of the auxiliary DG-FET associated to the signal gate terminal is avoided or reduced by the inventive amplifier circuit, since a source inverse feedback results by the increasing resistance of the (source side) channel associated to the control gate terminal when reducing the amplification. Additionally, the inventive amplifier circuit avoids substrate control of the source side channel of the second DG-FET since the source region thereof is then at the substrate potential.

The simultaneous substrate control of the drain side channel in the inventive amplifier circuit results in the negative effects connected thereto at the signal gate terminal being less pronounced than in the control gate terminal. Simulation results show that the inventive amplifier circuit comprises a more uniform and flatter current superelevation and thus a considerably smoother course of the gain characteristic.

It is an advantage of the present invention that the disadvantages of manufacturing the second DG-FET in a common well can be eliminated easily by avoiding the problems of the prior art even with a "one well technology" by means of the inventive design.

BRIEF DESCRIPTION OF THE DRAWINGS

Preferred embodiments of the present invention will be detailed subsequently referring to the appended drawings, in which.

DESCRIPTION OF THE PREFERRED EMBODIMENTS

Figure 1:
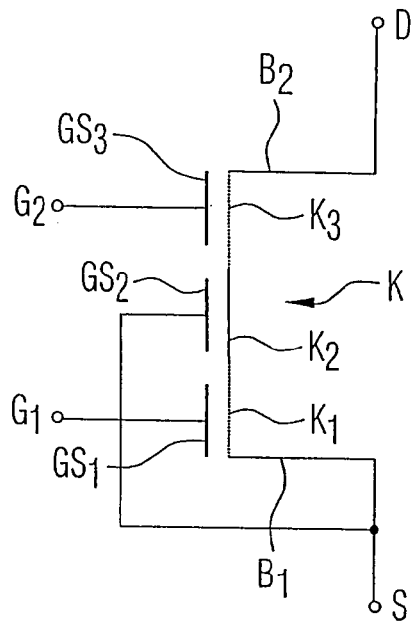
FIG. 1 shows two examples of multiple gate field-effect transistors.
Figure 1:
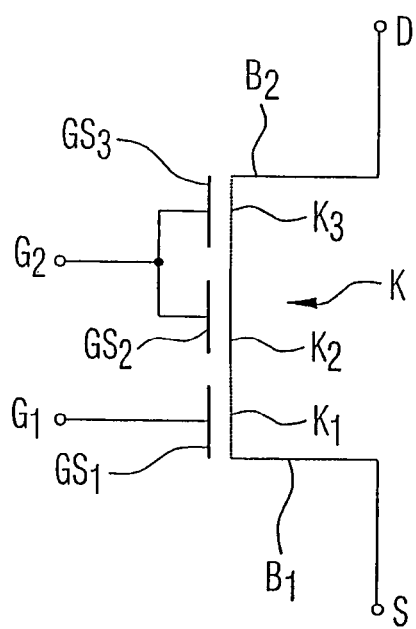

Preferred embodiments of the present invention will be detailed subsequently with reference to DG-FETs, as have been explained referring to FIG. 1, the implementation also applying to MG-FETs having more than two gate terminals.

Figure 2:
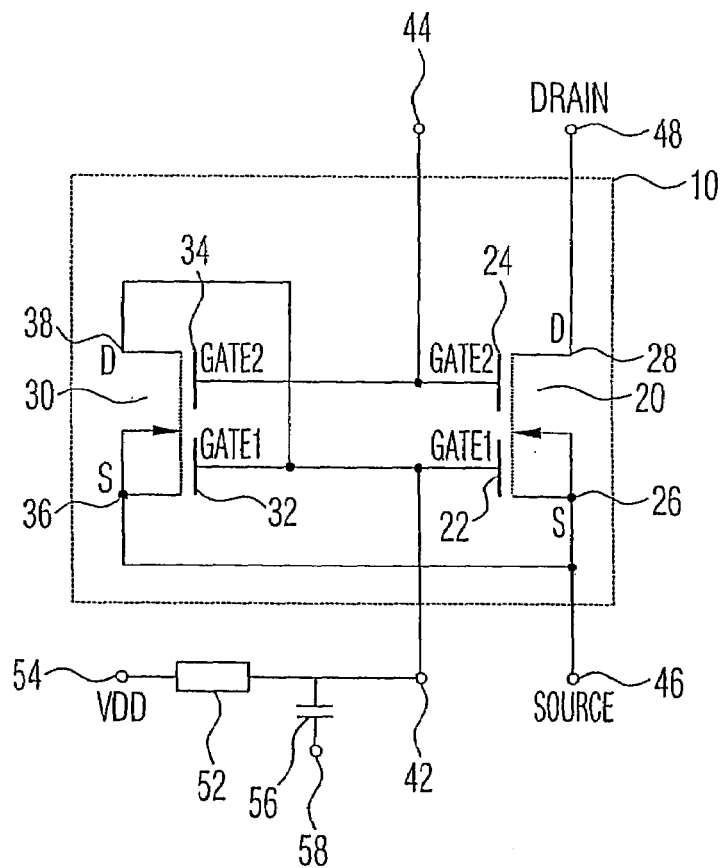
FIG. 2 shows a conventional amplifier circuit.
Figure 3:
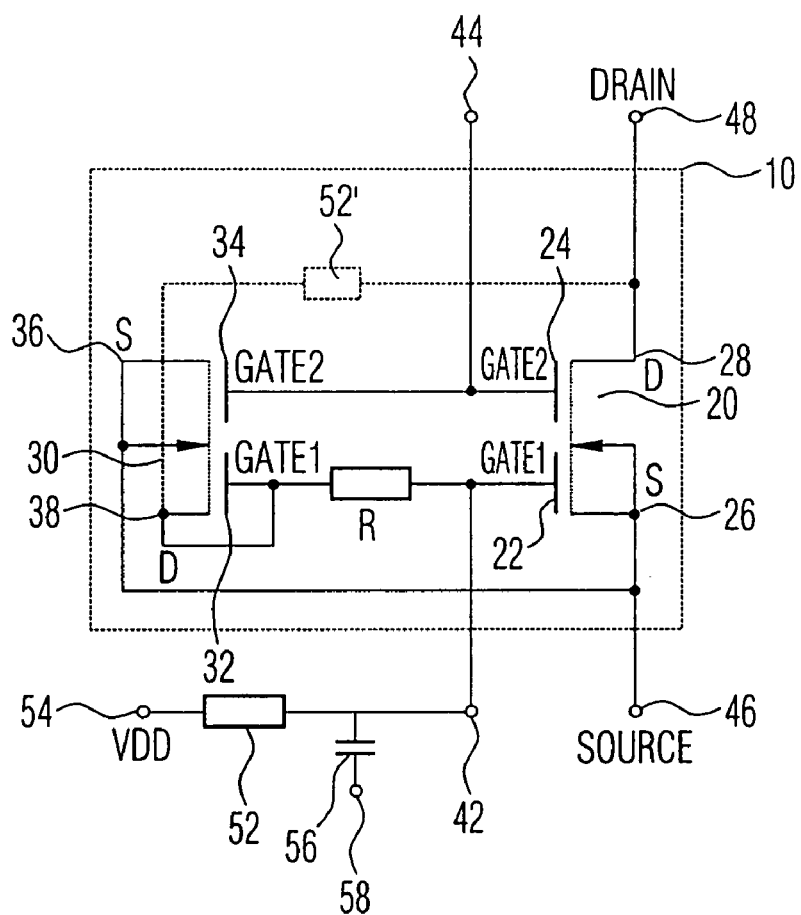
FIG. 3 shows a schematic circuit diagram of an amplifier circuit according to a first embodiment of the present invention.

FIG. 3 is a schematic circuit diagram of an amplifier circuit according to a first embodiment of the present invention. The inventive amplifier circuit illustrated in FIG. 3 differs from the conventional amplifier circuit illustrated in FIG. 2 in that the auxiliary tetrode or the second DG-FET 30 acts in reverse operation. Again, the terminal 36, serving as a source in the operating state due to the potential conditions, of the second DG-FET 30 is connected to the source terminal 26 of the first DG-FET 20 and to the terminal 46 of the amplifier circuit 10. In contrast to the conventional amplifier circuit illustrated with reference to FIG. 2, this signal gate terminal 32 of the second DG-FET 30 connected to the signal gate terminal 22 of the first DG-FET 20, however, is not arranged on the source side but on the drain side. Correspondingly, the control gate terminal 34 of the second DG-FET 30 connected to the control gate terminal 24 of the first DG-FET 20 is not arranged on the drain side but on the source side. Put differently, in this case the first region $B_1$ (see FIG. 1) of the second DG-FET is operated as a drain, whereas in the conventional circuit according to FIG. 2 the second region $B_2$ serves as a drain. The second region $B_2$ (see FIG. 1) of the second DG-FET forms the source which, in the conventional circuit according to FIG. 2, is formed by the first region $B_1$. The first region $B_1$ of the second DG-FET is thus connected to the signal gate terminal thereof via the drain terminal 38.

The embodiment of an inventive amplifier circuit illustrated in FIG. 3 additionally comprises a resistor R connected between the signal input 42 and the signal gate terminal 32 of the second DG-FET. This resistor avoids the auxiliary tetrode or the second DG-FET 30 to reduce the gain of the main tetrode or of the first DG-FET 20. Employing the resistor R in this meaning is of advantage, but not a necessary feature.

Additionally, the amplifier circuit 10 includes a biasing network to provide a direct voltage vdd to the drain terminal 38 of the second DG-FET 30. According to an example, the biasing network is external and includes a resistor 52 and a direct signal terminal 54.

Alternatively, the resistor 52' (see dashed lines in FIG. 3) may be integrated on a chip together with the first DG-FET 20 and the second DG-FET 30, the direct signal terminal, together with the drain terminal 28 of the first DG-FET 20, being connected to the external terminal (drain) 48 of the amplifier circuit 10.

Figure 4:
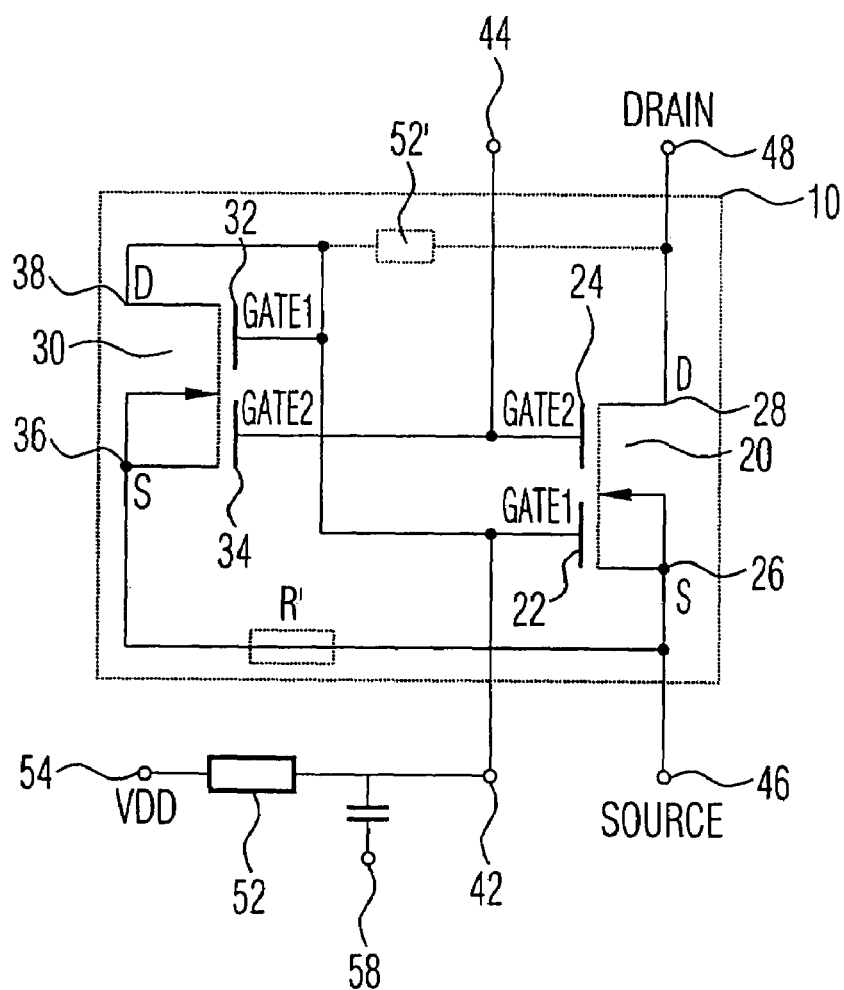
FIG. 4 shows a schematic circuit diagram of an amplifier circuit according to a second embodiment of the present invention.

FIG. 4 is a schematic circuit diagram of an amplifier circuit 10 according to a second preferred embodiment of the present invention. This second embodiment differs from the first embodiment illustrated with reference to FIG. 2 by the configuration (such as, for example, the gate lengths) of the gate structures of the second DG-FET associated to the gate terminals 32, 34. Whereas conventionally a source side gate structure abutting on a first region $B_1$ (see FIG. 1) is shorter than the drain side gate structure abutting on a second region $B_2$ (see FIG. 1), the opposite applies in this case. In the embodiment illustrated in FIG. 4, the signal gate terminal 32 of the second DG-FET is connected to a gate structure arranged adjacent to the second region $B_2$ (see FIG. 1). The control gate terminal 34 of the second DG-FET is connected to a gate structure arranged adjacent to the first region $B_1$ (see FIG. 1). The source terminal 36 in this example, like in that of FIG. 2, is connected to the first region $B_1$ (see FIG. 1). Also, the drain terminal 38, like in the example of FIG. 2, is connected to the second region $B_2$ (see FIG. 1). This, compared to FIG. 2, means an exchange of the two gate terminals 32, 34 at the second DG-FET. Additionally, the amplifier circuit according to the second embodiment of the present invention illustrated with reference to FIG. 4 does not comprise the resistor 70 of the amplifier circuit 10 illustrated with reference to FIG. 3. Alternatively, a resistor may be connected between the signal input 42 and the signal gate terminal 32 of the second DG-FET in the second embodiment illustrated in FIG. 4.

Among other things, the difference between the two embodiments (FIGS. 3 and 4) results from the fact that the nLDD region integrated in the drain in reverse operation (FIG. 3) has the effect of a source inverse feedback resistor. A similar effect can be achieved by arranging an additional resistor R' (indicated in dashed lines) between the terminal 36 and the terminal 46 in the circuit of FIG. 4.

In this example, too, the supply network, like in FIG. 3, may be formed externally or in a way integrated with the DG-FETs.

Figure 5:
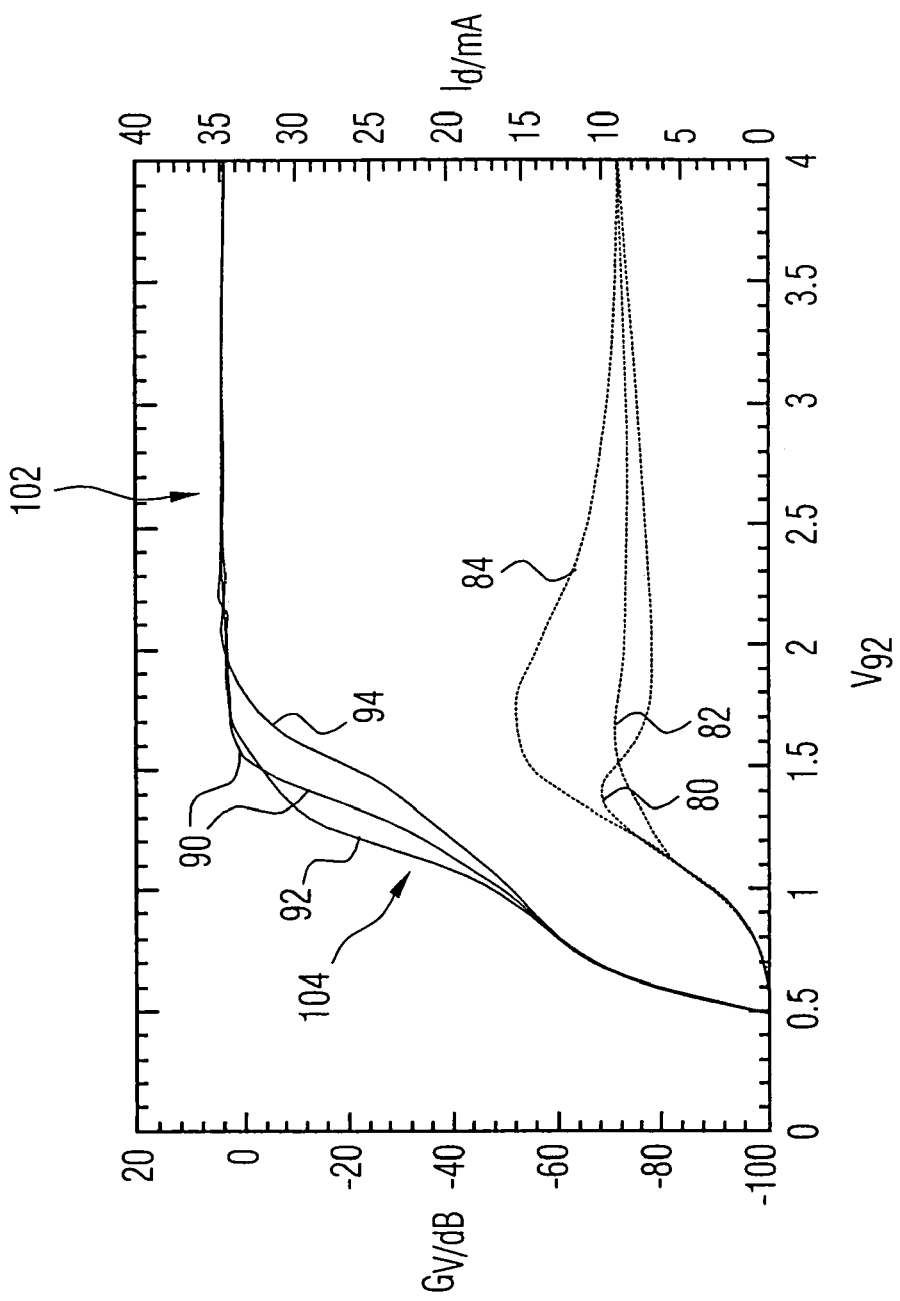
FIG. 5 shows a schematic graphical illustration of the gain characteristic of the inventive amplifier circuit and of a conventional amplifier circuit.

FIG. 5 schematically illustrates the dependence of the voltage gain and the drain current of the first DG-FET on the control voltage applied to the control input 44. The control voltage $V_{g2}$ applied to the control input 44 is associated to the abscissa, whereas the voltage gain $G_v$ (in dB; continuous lines) and the drain current $I_d$ (in mA; dashed lines) are associated to the ordinate.

The dashed lines 80, 82, 84 indicate the dependence of the drain current $I_d$ on the control voltage $V_{g2}$ for the conventional amplifier circuit illustrated with reference to FIG. 2 (curve 80), for the amplifier circuit according to the first embodiment of the present invention illustrated with reference to FIG. 3 (curve 82) and for the amplifier circuit according to the second embodiment of the present invention illustrated with reference to FIG. 4 (curve 84). The continuous lines 90, 92, 94 show the dependence of the voltage gain $G_v$ on the control voltage $V_{g2}$ for the conventional amplifier circuit illustrated with reference to FIG. 2 (curve 90), for the amplifier circuit according to the first embodiment of the present invention illustrated in FIG. 3 (curve 92) and for the amplifier circuit according to the second embodiment of the present invention illustrated in FIG. 4 (curve 94).

The voltage gain $G_v$ has, for both the conventional amplifier circuit (curve 90) and for the amplifier circuit according to the present invention (curves 92, 92), a saturation region 102 above $V_{g2}=1.6$ V and $V_{g2}=1.7$ V and $V_{g2}=2.0$ V, respectively, within which the voltage gain $G_v$ is largely constant, independently of the control voltage $V_{g2}$. For lower control voltages $V_{g2}$, all three amplifier circuits comprise an AGC region 104 within which the voltage gain $G_v$ has a strictly monotonic dependence on the control voltage $V_{g2}$. The difference between the curves 90 (FIG. 3) and 94 (FIG. 4) results from the "reversed" wiring of the FETs since they have an asymmetrical setup, due to the LDD regions provided on either the source side or the drain side. A similar result could also be achieved by a symmetrical FET, such as, for example, a conventional MOS-FET having a resistor at a drain or a source terminal. It becomes obvious from curve 80 that the drain current $I_d$ has a marked superelevation at a control voltage of $V_{g2}=1.4$ V. The marked break of the gain characteristic of the conventional amplifier circuit, at the control voltage $V_{g2}=1.6$ V, in curve 90 is causally connected with this abrupt superelevation in the drain current $I_d$.

In contrast, it can be seen that the amplifier circuit according to the first embodiment of the present invention illustrated in FIG. 3 only has a minimum and very flat superelevation of the drain current $I_d$ (curve 82) and a considerably smoother transition from the saturation region 102 to the AGC region 104 (at $V_{g2}=1.5$ V). The amplifier circuit according to the second embodiment of the present invention illustrated in FIG. 4 also has a less abrupt superelevation in the drain current $I_d$ (curve 84) and a smoother transition of the voltage gain $G_v$ from the saturation region 102 to the AGC region 104 (at $V_{g2}=2$ V) (curve 94). Thus, the voltage gain $G_v$ of the second embodiment, in the AGC region 104, also has, on average, a smaller gradient than the voltage gains of the conventional amplifier circuit and the amplifier circuit according to the first embodiment of the present invention.

Referring to FIG. 5, it may easily be recognized that the present invention achieves a slight or small and uniform superelevation of the drain current $I_d$ and a considerably smoother transition of the voltage gain $G_v$ from the saturation region 102 to the AGC region 104 when regulating the control voltage $V_{g2}$.

The present invention or inventive auxiliary wiring of a DG-FET within an amplifier circuit is suitable for all DG-FETs, in particular for dual gate MOS FETS, the gain of which is controlled or determined by a DC potential or a direct voltage. Tuner tetrodes are examples of this. Preferably, the inventive amplifier circuit 10, that is in particular the first DG-FET 20 and the second DG-FET 30, are integrated on a chip.

Although the preferred embodiments of the present invention have been described with reference to DG-FETS, this is, as has been mentioned above, not to be taken as a limitation. The implementations also apply to MG-FETs having more than two gate terminals. Two or more signal gate terminals and/or two or more control gate terminals may, for example, be provided without departing from the principles on which the present invention is based.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An amplifier circuit comprising:
   a signal input;
   a first multiple gate field-effect transistor having a source terminal, a drain terminal, at least one signal gate terminal operably coupled to receive an input signal from the signal input and at least one control gate terminal operably coupled to receive a control signal; and a second multiple gate filed-effect transistor having a source terminal, a drain terminal, at least one signal gate terminal connected to the signal gate terminal of the first multiple gate field-effect transistor, and a control gate terminal connected to the control gate terminal of the first multiple gate field-effect transistor, each of the multiple gate field-effect transistor further comprising a first region associated with a drain terminal or a source terminal, a second region associated with a source terminal or a drain terminal, a channel region arranged between the first region and the second region, at least one first gate structure associated with a first portion of the channel region and arranged adjacent to the first region, the first gate structure being associated with the signal gate terminal or with the control gate terminal, at least one second gate structure associated with a second portion of the channel region and arranged adjacent to the second region, the second gate structure being associated with the signal gate terminal or with the control gate terminal, wherein the second multiple gate field-effect transistor has a signal gate structure comprising that of the first or second gate structure that is associated with the signal gate terminal, the signal gate structure connected to that of the first or second region which is adjacent to the channel region of the signal gate structure, wherein in the first multiple gate field-effect transistor, the signal gate terminal is connected to the first gate structure, the control gate terminal is connected to the second gate structure, the source terminal is connected to the first region, and the drain terminal is connected to the second region, and wherein in the second multiple gate field-effect transistor, the signal gat terminal is connected to the first gate structure, the control gate terminal is connected to the second gate structure, the source terminal is connected to the second region, and the drain terminal is connected to the first region, the signal gate terminal of the second multiple gate field-effect transistor being connected to the drain terminal.

2. An amplifier circuit comprising:

a signal input;

a first multiple gate field-effect transistor having a source terminal, a drain terminal, at least one signal gate terminal operably coupled to receive an input signal from the signal input and at least one control gate terminal operably coupled to receive a control signal, and a second multiple gate field-effect transistor having a source terminal, a drain terminal, at least one signal gate terminal connected to the signal gate terminal of the first multiple gate field-effect transistor, and a control gate terminal connected to the control gate terminal of the first multiple gate field-effect transistor, each of the multiple gate field-effect transistor further comprising a first region associated with a drain terminal or a source terminal, a second region associated with a source terminal or a drain terminal, a channel region arranged between the first region and the second region, at least one first gate structure associated with a first portion of the channel region and arranged adjacent to the first region, the first gate structure being associated with the signal gate terminal or with the control gate terminal, at least one second gate structure associated with a second portion of the channel region and arranged adjacent to the second region, the second gate structure being associated with the signal gate terminal or with the control gate terminal, wherein the second multiple gate field-effect transistor has a signal gate structure comprising that of the first or second gate structure that is associated with the signal gate terminal, the signal gate structure connected to that of the first or second region which is adjacent to the channel region of the signal gate structure, wherein in the first multiple gate field-effect transistor, the signal gate terminal is connected to the first gate structure, the control gate terminal is connected to the second gate structure, the source terminal is connected to the first region, and the drain terminal is connected to the second region, and wherein in the second multiple gate field-effect transistor, the signal gate terminal is connected to the second gate structure, the control gate terminal is connected to the first gate struture, the source terminal is connected to the first region, and the drain terminal is connected to the second region, the signal gate terminal of the second multiple gate field-effect transistor being connected to the drain terminal.

3. The amplifier circuit according to claim 1, wherein the source terminal of the first multiple gate field-effect transistor is connected to the source terminal of the second multiple gate field-effect transistor.

4. The amplifier circuit according to claim 1, wherein the signal gate terminal of the first multiple gate field-effect transistor is connected to the signal gate terminal of the second multiple gate field-effect transistor via a resistor.

5. The amplifier circuit according to claim 1, wherein a substrate terminal of the second multiple gate field-effect transistor is conductively connected to the source terminal of the second multiple gate field-effect transistor.

6. The amplifier circuit according to claim 1, wherein a portion of the channel associated with the second gate structure is longer than a portion of the channel associated with the first gate structure.

7. The amplifier circuit according to claim 1, further comprising a resistor connected between the source terminal of the second multiple gate field-effect transistor and the source terminal of the first multiple gate field-effect transistor.

8. The amplifier circuit according to claim 1, further including a biasing network configured to provide a direct voltage to the drain terminal of the second multiple gate field-effect transistor.

9. The amplifier circuit according to claim 8, wherein the biasing network includes a resistor and a direct signal terminal.

10. The amplifier circuit according to claim 1, wherein the first multiple gate field-effect transistor and the second multiple gate field-effect transistor are integrated on a chip.

11. The amplifier circuit according to claim 9, wherein the resistor of the biasing network is integrated on a chip together with the first multiple gate field-effect transistor and the second multiple gate field-effect transistor.

12. An arrangement comprising:

a signal input;

a first field-effect transistor having a first terminal, a second terminal, at least a first gate terminal operably coupled to receive an input signal from the signal input and at least one control gate terminal operably coupled to receive a control signal; and a second field-effect transistor having a first terminal, a second terminal, at least a first gate terminal connected to the first gate terminal of the first field-effect transistor, and at least one control gate terminal connected to the at least one control gate terminal of the first field-effect transistor, each of the multiple gate field-effect transistor further comprising a first region associated with the first terminal, a second region associated with the second terminal, and a channel region arranged between the first region and the second region, wherein the second field-effect transistor has a signal gate structure in a first portion of the channel region adjacent to the first region, the signal gate structure associated with the first gate terminal, the signal gate structure connected to the first region, and wherein a drain terminal of the second field-effect transistor and a source terminal of the first field-effect transistor are associated with the first region.

13. An arrangement comprising:
a signal input:
a first field-effect transistor having a first terminal, a second terminal, at least a first gate terminal operably coupled to receive an input signal from the signal input and at least one control gate terminal operably coupled to receive a control signal; and a second field-effect transistor having a first terminal, a second terminal, at least a first gate terminal connected to the first gate terminal of the first field-effect transistor, and at least one control gate terminal connected to the at least one control gate terminal of the first field-effect transistor, each of the multiple gate field-effect transistor further comprising a first region associated with the first terminal, a second region associated with the second terminal, and a channel region arranged between the first region and the second region, wherein the second field-effect transistor has a signal gate structure in a first portion of the channel region adjacent to the first region, the signal gate structure associated with the first gate terminal, the signal gate structure connected to the first region, and wherein drain terminals of the first and second field-effect transistors are associated with the first region.

14. The arrangement of claim 12, wherein a source terminal of the first field-effect transistor is connected to a source terminal of the second field-effect transistor.

15. The arrangement of claim 12, wherein the first gate terminal of the first field-effect transistor is connected to the first gate terminal of the second field-effect transistor via a resistor.

16. The arrangement of claim 12, wherein:
the second field-effect transistor has a control gate structure in a second portion of the channel region adjacent to the second region, the control gate structure associated with the second gate terminal,
and the second portion of the channel is longer than the first portion of the channel.

17. The arrangement of claim 12, further comprising a resistor connected between a source terminal of the second field-effect transistor and a source terminal of the first field-effect transistor.

18. The arrangement according to claim 12, further including a biasing network configured to provide a direct voltage to a drain terminal of the second field-effect transistor.

19. An amplifier circuit comprising:
a signal input;
a first multiple gate field-effect transistor having a source terminal, a drain terminal, at least one signal gate terminal operably coupled to receive an input signal from the signal input and at least one control gate terminal operably coupled to receive a control signal; and a second multiple gate field-effect transistor having a source terminal, a drain terminal, at least one signal gate terminal connected to the signal gate terminal of the first multiple gate field-effect transistor, and a control gate terminal connected to the control gate terminal of the first multiple gate field-effect transistor, each of the multiple gate field-effect transistor further comprising a first region associated with a drain terminal or a source terminal, a second region associated with a source terminal or a drain terminal, a channel region arranged between the first region and the second region, at least one first gate structure associated with a first portion of the channel region and arranged adjacent to the first region, the first gate structure being associated with the signal gate terminal or with the control gate terminal, at least one second gate structure associated with a second portion of the channel region and arranged adjacent to the second region, the second gate structure being associated with the signal gate terminal or to the control gate terminal, wherein the second multiple gate field-effect transistor has a signal gate structure comprising that of the first or second gate structure that is associated with the signal gate terminal, the signal gate structure connected to that of the first or second region which is adjacent to the channel region of the signal gate structure, and wherein a substrate terminal of the second multiple gate field-effect transistor is conductively connected to the source terminal of the second multiple gate field-effect transistor.

20. An amplifier circuit comprising:
a signal input;
a first multiple gate field-effect transistor having a source terminal, a drain terminal, at least one signal gate terminal operably coupled to receive an input signal from the signal input and at least one control gate terminal operably coupled to receive a control signal; and a second multiple gate field-effect transistor having a source terminal, a drain terminal, at least one signal gate terminal connected to the signal gate terminal of the first multiple gate field-effect transistor, and a control gate terminal connected to the control gate terminal of the first multiple gate field-effect transistor, each of the multiple gate field-effect transistor further comprising a first region associated with a drain terminal or a source terminal, a second region associated with a source terminal or a drain terminal, a channel region arranged between the first region and the second region, at least one first gate structure associated with a first portion of the channel region and arranged adjacent to the first region, the first gate structure being associated with the signal gate terminal or with the control gate terminal, at least one second gate structure associated with a second portion of the channel region and arranged adjacent to the second region, the second gate structure being associated with the signal gate terminal or to the control gate terminal, wherein the second multiple gate field-effect transistor has a signal gate structure comprising that of the first or second gate structure that is associated with the signal gate terminal, the signal gate structure connected to that of the first or second region which is adjacent to the channel region of the signal gate structure, and wherein a portion of the channel associated with the second gate structure is longer than a portion of the channel associated with the first gate structure.

21. An amplifier circuit comprising:

a signal input;

a first multiple gate field-effect transistor having a source terminal, a drain terminal, at least one signal gate terminal operably coupled to receive an input signal from the signal input and at least one control gate terminal operably coupled to receive a control signal; and a second multiple gate field-effect transistor having a source terminal, a drain terminal, at least one signal gate terminal connected to the signal gate terminal of the first multiple gate field-effect transistor, and a control gate terminal connected to the control gate terminal of the first multiple gate field-effect transistor, each of the multiple gate field-effect transistor further comprising a first region associated with a drain terminal or a source terminal, a second region associated with a source terminal or a drain terminal, a channel region arranged between the first region and the second region, at least one first gate structure associated with a first portion of the channel region and arranged adjacent to the first region, the first gate structure being associated with the signal gate terminal or with the control gate terminal, at least one second gate structure associated with a second portion of the channel region and arranged adjacent to the second region, the second gate structure being associated with the signal gate terminal or with the control gate terminal, wherein the second multiple gate field-effect transistor has a signal gate structure comprising that of the first or second gate structure that is associated with the signal gate terminal, the signal gate structure connected to that of the first or second region which is adjacent to the channel region of the signal gate structure, a biasing network configured to provide a direct voltage to the drain terminal of the second multiple gate field-effect transistor, wherein the biasing network includes a resistor and a direct signal terminal.

22. The amplifier circuit according to claim 21, wherein the resistor of the biasing network is integrated on a chip together with the first multiple gate field-effect transistor and the second multiple gate field-effect transistor.

23. An arrangement comprising:

a signal input;

a first field-effect transistor having a first terminal, a second terminal, at least a first gate terminal operably coupled to receive an input signal from the signal input and at least one control gate terminal operably coupled to receive a control signal; and a second field-effect transistor having a first terminal, a second terminal, at least a first gate terminal connected to the first gate terminal of the first field-effect transistor, and at least one control gate terminal connected to the at least one control gate terminal of the first field-effect transistor, each of the multiple gate field-effect transistor further comprising a first region associated with the first terminal, a second region associated with the second terminal, and a channel region arranged between the first region and the second region, wherein the second field-effect transistor has a signal gate structure in a first portion of the channel region adjacent to the first region, the signal gate structure associated with the first gate terminal, the signal gate structure connected to the first region, wherein the second field-effect transistor has a control gate structure in a second portion of the channel region adjacent to the second region, the control gate structure associated with the second gate terminal, and wherein the second portion of the channel is longer than the first portion of the channel.

* * * * *